United States Patent [19]

Oigawa

[11] Patent Number: 5,212,405
[45] Date of Patent: May 18, 1993

[54] COMPOSITE LEAD FRAME

[75] Inventor: Kinya Oigawa, Oume, Japan

[73] Assignee: Sumitomo Metal Mining Company, Limited, Tokyo, Japan

[21] Appl. No.: 818,089

[22] Filed: Jan. 8, 1992

[51] Int. Cl.$^5$ .............................................. H01L 23/48
[52] U.S. Cl. ..................................... 257/672; 257/666
[58] Field of Search ...................... 357/70, 72, 74, 80

[56] References Cited

U.S. PATENT DOCUMENTS

| 4,949,158 | 8/1990 | Ueda | 357/70 |
| 5,016,084 | 5/1991 | Nakao | 357/72 |
| 5,095,359 | 3/1992 | Tanaka et al. | 357/74 |

Primary Examiner—Rolf Hille
Assistant Examiner—S. V. Clark
Attorney, Agent, or Firm—Watson, Cole, Grindle & Watson

[57] ABSTRACT

A composite lead frame in which an island formed with a greater diameter than that of a semiconductor device to be mounted is attached to a lead frame main body having leads being integrally protruded inward, the top ends of the leads are bonded with corresponding fine leads of the island at one ends thereof and lead terminals of the semiconductor device are connected respectively to the other ends of the corresponding fine leads, wherein the composite lead frame comprises an insulating sheet appended on one surface of the island and having the fine leads secured thereto being protruded outward and through holes disposed discretely passing through the insulating sheet and the island so that the wire bonding portions at the other ends of the fine leads are exposed.

4 Claims, 2 Drawing Sheets

COMPOSITE LEAD FRAME

BACKGROUND OF THE INVENTION

1. Field of the Invention

The present invention concerns a composite lead frame used for the packaging of a semiconductor device.

2. Description of the Prior Art

A composite lead frame used for packaging LSIs with 150 or more pins working at an electric power of 2 to 3 watt grade, such as gate arrays for CMOS or ECL having from several thousands to several hundreds of gates, includes a lead frame integrally formed with an island for mounting a semiconductor device and a plurality of leads extending outwardly from the island in which the island is formed greater than the size of the device, with an opening for a semiconductor device (hereinafter referred to as a device hole) being disposed at a central area on the surface of the island, and a polyimide film having a plurality of fine leads corresponding to the leads of the frame on the surface is bonded by means of an adhesive epoxy to the surface thereof. This intends to reduce the packaging cost by mounting LSI on a plastic QFP which is less expensive than PGA.

As LSIs have been increased in the degree of integration and made more versatile in the form in recent years, there has been an increasing demand for making the number of pins greater, reducing the size, increasing the operation speed and enhancing heat dissipation capability. and a composite lead frame can satisfy such requirements. However, in the conventional composite lead frame structure, bondability is poor as compared with conventional lead frames, lowering productivity. This is attributable to the soft and flexible nature of the material of an underlying substrate for the inner leads in a conventional composite lead frame comprising a polyimide film and an epoxy adhesive, which diffuses the bonding load and the ultrasonic power of the wire bonder toward the underlying substrate to worsen the bonding strength or homogeneity of the bonding of the wire.

OBJECT AND SUMMARY OF THE INVENTION

An object of the present invention to provide a composite lead frame capable of overcoming the foregoing problems.

The foregoing object can be attained according to the present invention by a composite lead frame in which an island formed with a greater diameter than that of a semiconductor device to be mounted is attached to a lead frame main body having leads being integrally protruded inward, the top ends of the leads are bonded with corresponding fine leads of the island at one ends thereof and lead terminals of the semiconductor device are connected respectively to other ends of the corresponding fine leads, wherein the composite lead frame comprises an insulating sheet appended on one surface of the island and having the fine leads secured thereto being protruded outward and through holes disposed discretely passing through the insulating sheet and the island so that the wire bonding portions at the other ends of the fine leads are exposed.

With the construction as described above, the island having a larger diameter that of the semiconductor device to be mounted is attached to the lead frame main body, having the leads being protruded integrally inward, such that the fine leads of the island protruded outward from the insulating sheet appended on one surface of the island are bonded at the other ends thereof. Then, since the through holes are disposed discretely passing through the insulating sheet and the island such that the wire bonding portions at the other ends of the fine leads are exposed, the fine lead and the lead terminal of the semiconductor device are wire bonded by supporting the fine leads directly at the portion of the holes by a flat plate-like bonding jig. Accordingly, the composite lead frame can package the semiconductor device in a state in which the bondability of the wire bonding for the semiconductor device is improved.

DESCRIPTION OF THE ACCOMPANYING DRAWINGS

DESCRIPTION OF THE PREFERRED EMBODIMENTS

Figure 1:
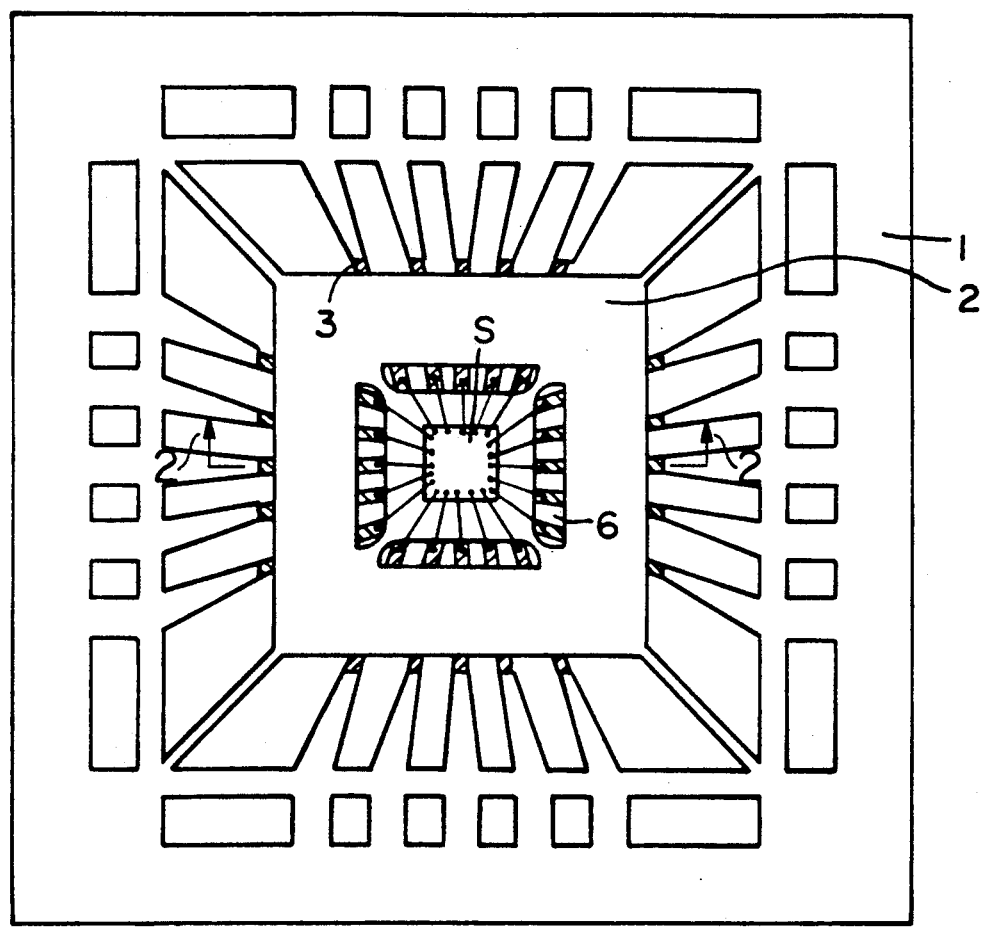
FIG. 1 is an explanatory plan view illustrating a first embodiment of composite lead free according to the present invention.
Figure 2:
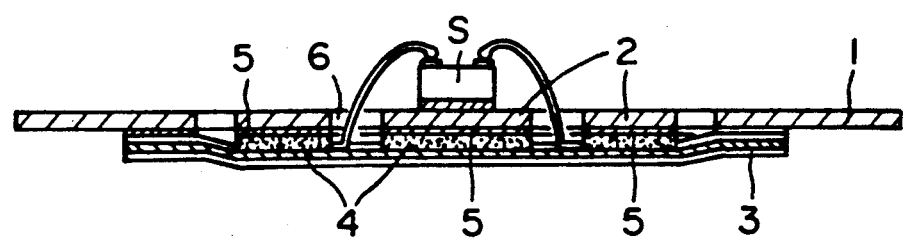
FIG. 2 is a cross sectional view taken along line 2—2 in FIG. 1.

In FIGS. 1 and 2, a lead frame main body 1 is made of a metal plate by punching or etching and has an island 2 in a central portion. The island 2 is formed with a larger diameter than that of a semiconductor device S. An insulating sheet 4 having fine leads 3, each comprising a copper foil applied with gold plating formed at the surface corresponding to the leads of the lead frame main body 1, is appended by means of an adhesive layer 5 on the surface of the island opposite to the side of the main body 1 to which the semiconductor device is mounted. The fine lead 3 protrudes to the outside of the insulating sheet 4. The protruded fine lead 3 is bonded by being over-laid on the inner top end of the lead of the lead frame main body 1.

Further, through holes 6 passing through the insulating sheet 4 and the island 2 are disposed discretely (at four positions in FIG. 1) at the periphery of the semiconductor device mounting portion, so that the wire bonded portions of the fine leads are exposed.

In the composite lead frame according to the first embodiment, the pressure and the ultrasonic power of the wire bonder can be concentrated to the fine lead 3 by directly supporting the fine lead 3 by a flat plate-like bonding jig (not illustrated), thereby improving bondability.

The composite lead frame or the first embodiment may have a usual basic structure, and through holes 6 are previously formed in the island 2 of the lead frame main body, while photoresist is coated on the surface of a metal foil formed on one surface of a polyimide film or the like. Then, it is exposed by using a desired mask, etching is applied after development to form a lead pattern and then the polyimide film is etched into an island shape and then the through holes 6 are formed. A polyimide film obtained by cutting is bonded by means of an epoxy resin adhesive to the island 2.

The fine lead 3 and the inner top end of the lead of the lead frame main body 1 can be easily bonded through thermal compression gold-gold bonding by applying gold plating to both of them.

When bonding is conducted by using the composite lead frame according to the first embodiment, the rate of bonding error was reduced from 1/200 in the prior art to 1/20,000 under the conditions of 40 to 120 g of a bonding load, 30 to 50 of an ultrasonic power and 150° to 250° C. of a bonding temperature, to remarkably improve productivity. Further, the through holes in the composite lead frame of the first embodiment also have the effect of increasing the close bondability of the encapsulating resin.

Figure 3:
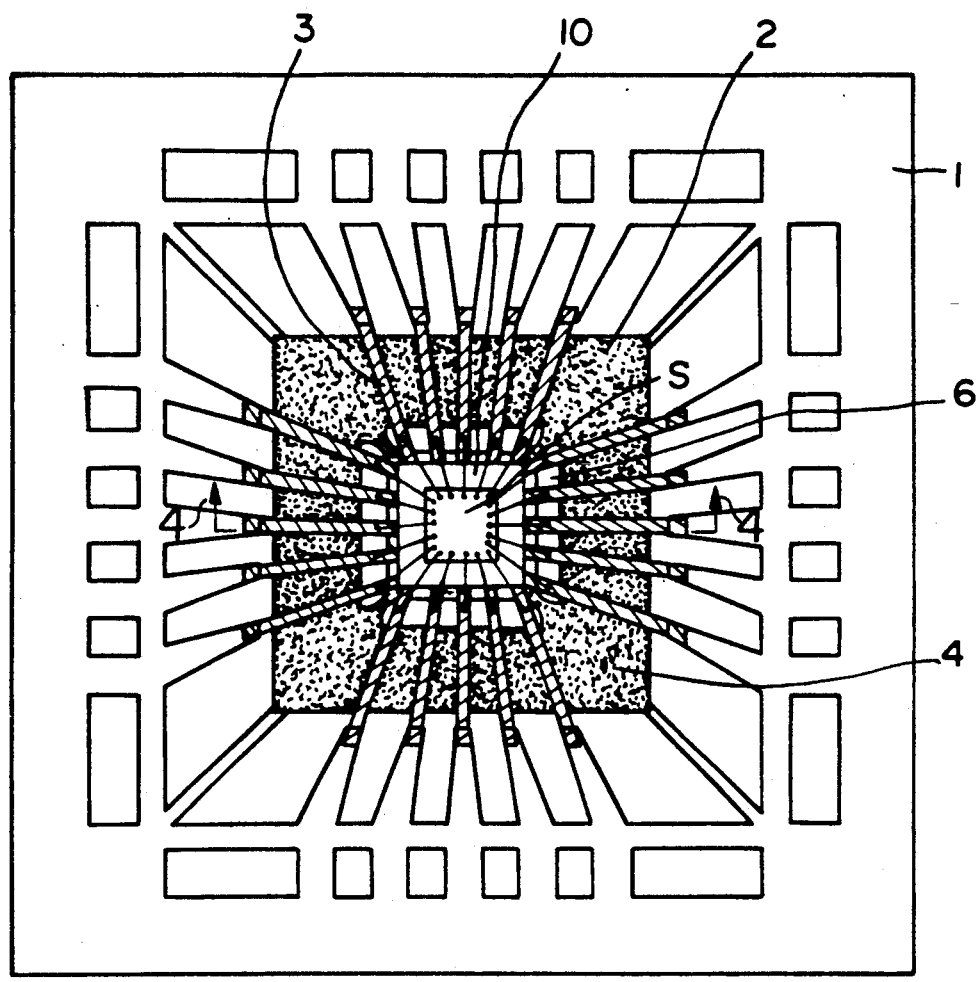
FIG. 3 is an explanatory plan view illustrating a second embodiment of composite lead frame according to the present invention.
Figure 4:
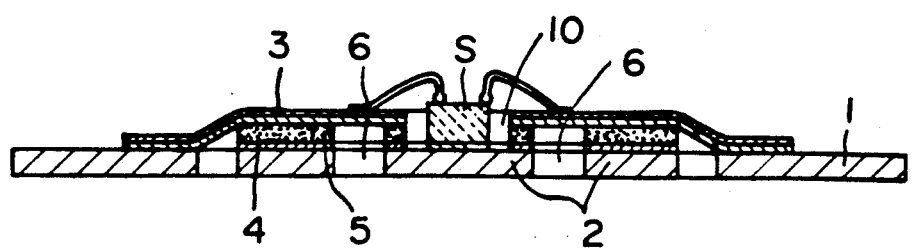
FIG. 4 is a cross sectional view taken along line 4—4 in FIG. 3.

In FIGS. 3 and 4, a lead frame main body 1 is made of a metal plate by punching or etching and has an island 2 at a central portion. The island 2 is made greater with a larger diameter than that of a semiconductor device S. An insulating sheet 4 having a device hole 10 for mounting the semiconductor device S on the side of mounting the semiconductor device s, and having fine leads 3, each comprising a copper foil applied with gold plating formed corresponding to leads of the lead frame main body 1, at the surface is appended by way of an adhesive layer 5 to the island. The fine leads 3 protrude outward from the insulating sheet 4. The protruded fine lead 3 is bonded by being over-laid on the inner top end of the lead of the lead frame main body 1. Further, through holes 6 passing through the insulating sheet 4 and the island 2 are disposed discretely (at four positions in FIG. 3) at the periphery of the device hole 10, so that the lower surface of the fine lead 3 at the wire bonding position is exposed.

In the composite lead frame according to the second embodiment, the pressure of the capillary and the ultrasonic power of the wire bonder can be concentrated on the fine leads 3 by using a jig fitting into the through holes 6 and directly holding the fine leads 3 of the bonding area to improve bondability.

The composite lead frame of the second embodiment may have a usual basic structure, and through holes 6 are previously disposed to the island 2 of the lead frame main body 1, while a photoresist is coated to the surface of the metal foil disposed on one side of the polyimide film. Then, exposure is applied by using a desired mask and etching is applied after development to form a lead pattern. Then, the polyimide film is etched into an island shape, as well as the through holes 6 are formed, and the polyimide film obtained by cutting is appended to the island 2 by an epoxy resin type adhesive.

The fine lead 3 and the inner top end of the lead of the lead frame main body 1 can be easily bonded through gold-gold thermal compression bonding by applying gold metal to both of them.

When bonding was applied by using the composite lead frame according to the first embodiment as described above, the rate of bonding error was decreased from 1/200 in the prior art to 1/20,000, under the conditions of 40 to 120 g of a bonding load, 30 to 50 of ultrasonic power and 150° to 250° C. of bonding temperature, to remarkably improve the productivity. Further, the through holes 6 in the composite lead frame of the second embodiment can also provide an effect of improving the close bondability of the encapsulating resin.

Further, since the semiconductor device S is contained and mounted in the device hole 10, the thickness of the entire structure is reduced.

In the composite lead frame according to the present invention, the pressure of the capillary and the ultrasonic power of the wire bonder can be concentrated to the wiring portion. Accordingly, the bondability of the composite lead frame can be outstandingly improved under the conventional bonding conditions.

What is claimed is:

1. A composite lead frame which comprises:
   a lead frame main body which defines an outer portion and an inner island portion which has opposite surfaces, said outer portion including leads that extend inwardly towards said island portion, said island portion having a plurality of through holes therethrough and being adapted to mount a semiconductor device on one of said opposite surfaces thereof,
   a flexible polyimide insulating sheet bonded to one of said opposite surfaces of said island portion of said lead frame main body, said insulating sheet including through holes in register with said through holes in said lead frame main body, and
   a plurality of fine leads attached to said insulating sheet on a surface thereof opposite said island portion and which extend from inner ends to outer ends, said inner ends being in register with said through holes and to which the leads of a semiconductor device can be respectively attached, said outer ends being in contact with respective said leads that extend inwardly towards said island portion from the outer portion of said lead frame main body.

2. A composite lead frame according to claim 1, wherein said insulating sheet includes a device hole through which a semiconductor device mounted on said island portion can extend.

3. The combination of a composite lead frame and a semiconductor device, said composite lead frame comprising:
   a lead frame main body which defines an outer portion and an inner island portion which has opposite surfaces, said outer portion including leads that extend inwardly towards said island portion, said island portion having a plurality of through holes therethrough and being adapted to mount a semiconductor device on one of said opposite surfaces thereof,
   a flexible polyimide insulating sheet bonded to one of said opposite surfaces of said island portion of said lead frame main body, said insulating sheet including through holes in register with said through holes in said lead frame main body,
   a plurality of fine leads attached to said insulating sheet on a surface thereof opposite said island portion and which extend from inner ends to outer ends, said inner ends being in register with said through holes and to which the leads of a semiconductor device can be respectively attached, said outer ends being in contact with respective said leads that extend inwardly towards said island portion from the outer portion of said lead frame main body,
   and said semiconductor device being mounted on a surface of said island portion of said lead frame main body opposite said insulating sheet and including device leads which extend through said through holes and are connected to respective inner ends of said fine leads.

4. The combination of a composite lead frame and a semiconductor device, said composite lead frame comprising:

a lead frame main body which defines an outer portion and an inner island portion which has opposite surfaces, said outer portion including leads that extend inwardly towards said island portion, said island portion having a plurality of through holes therethrough and being adapted to mount a semiconductor device on one of said opposite surfaces thereof, a flexible polyimide insulating sheet bonded to one of said opposite surfaces of said island portion of said lead frame main body, said insulating sheet including through holes in register with said through holes in said lead frame main body and a device hole, a plurality of fine leads attached to said insulating sheet on a surface thereof opposite said island portion and which extend from inner ends to outer ends, said inner ends being in register with said through holes and to which the leads of a semiconductor device can be respectively attached, said outer ends being in contact with respective said leads that extend inwardly towards said island portion from the outer portion of said lead frame main body, and said semiconductor device being mounted on said island portion and extending through said device hole in said insulating sheet and including device leads connected to respective inner ends of said fine leads.

* * * * *